United States Patent [19]
Mitsui

[11] Patent Number: 5,596,270
[45] Date of Patent: Jan. 21, 1997

[54] IC TRANSPORTATION MECHANISM PROVIDED WITH A PLURALITY OF SUCTION

[75] Inventor: Osamu Mitsui, Tokyo, Japan

[73] Assignee: Ando Electric Co., Ltd., Tokyo, Japan

[21] Appl. No.: 391,057

[22] Filed: Feb. 21, 1995

[30] Foreign Application Priority Data

Feb. 28, 1994 [JP] Japan .................................. 6-054583

[51] Int. Cl.⁶ .............................. G01R 31/02; B65G 1/02
[52] U.S. Cl. ...................... 324/158.1; 324/758; 414/222; 901/40
[58] Field of Search ................................ 324/72.5, 158.1, 324/754, 758, 765; 414/222, 589, 590; 901/40

[56] References Cited

U.S. PATENT DOCUMENTS 5,227,717   6/1993   Tsurishima et al. .................... 324/72.5

*Primary Examiner*—Ernest F. Karlsen
*Attorney, Agent, or Firm*—Flynn, Thiel, Boutell & Tanis, P.C.

[57]          ABSTRACT

An IC transportation mechanism is provided with a transportation mechanism having a first and a second groups of suction units. When the first group of suction units retain ICs on a first supply stage by suction or release ICs on a first storage stage, a second group of suction units press ICs on IC sockets concurrently. When the second group of suction units retain ICs on a second supply stage by suction or release ICs onto a second storage stage, the first group of suction units press ICs on the IC sockets concurrently. As a result, it is possible to provide a high-speed IC transportation mechanism which concurrently takes in and out ICs during a reciprocation cycle of the transportation mechanism.

2 Claims, 13 Drawing Sheets

5,596,270

IC TRANSPORTATION MECHANISM PROVIDED WITH A PLURALITY OF SUCTION

BACKGROUND OF THE INVENTION

1. Field of the Invention

The present invention relates to an IC transportation mechanism provided with a plurality of suction units. The suction units transport ICs from a supply stage to a measuring portion and from the measuring portion to a storage stage. A device which employs such an IC transportation mechanism is, for example, an autohandler.

2. Description of the Related Art

A construction of an IC transportation mechanism of prior art will be described hereinafter with reference to FIG. 14. In FIG. 14, denoted at 5 is a measuring portion, 5A and 5B are IC sockets, 10 are ICs, 11 is a supply stage, 12 is a storage stage, 16 is a transportation mechanism, 16A and 16B are suction units and 16C and 16D are suction pads.

In FIG. 14, the supply stage 11 is arranged on a first column Y1 and shifts in the direction of the y-axis. The supply stage 11 comprises recesses 11A and 11B which are arranged on different rows. The ICs 10 are corrected in posture when they are placed on the recesses 11A and 11B. The storage stage 12 is arranged on a second column Y2 and shifts in the direction of the y-axis. The storage stage 12 comprises recesses 12A and 12B which are arranged on different rows. The ICs 10 are corrected in posture when they are placed on the recesses 12A and 12B.

In FIG. 14, the recesses 11A and 11B are the same in shape as the recesses 12A and 12B, each being a rectangular recess slightly larger than the external form of each IC 10. Since each recess is inclined at the entrance portion thereof, each IC 10 is guided by the inclined walls of each recess to be corrected in posture. The accurate positioning of the ICs 10 facilitates positioning the same relative to IC sockets 5A and 5B, described later, when the ICs 10 are transported to the IC sockets 5A and 5B from the supply stage 11, or facilitates transporting the ICs 10 from the storage stage 12 to next process.

The measuring portion 5 comprises the IC sockets 5A and 5B which are arranged on a column YM equidistant from the first column Y1 and the second column Y2. The row interval between the IC sockets 5A and 5B are the same as that between the recesses 12A and 12B.

The transportation mechanism 16 comprises the suction units 16A and 16B and the suction pads 16C and 16D. Each of the suction units 16A and 16B comprises therein a suction pad for retaining the upper surface of each IC 10 by negative pressure and a presser member to be brought into contact with the leads of the IC 10 is attached to each suction pad around the same. When the suction units 16A and 16B with the ICs 10 retained thereby by suction are pressed on the IC sockets 5A and 5B, the aforementioned presser bodies press the leads of the ICs 10 on the contacts of the IC sockets 5A and 5B. The suction pads 16C and 16D are the same as those provided inside the suction units 16A and 16B.

In FIG. 14, The suction units 16A and 16B and the suction pads 16C and 16D move vertically in the direction of the z-axis. The column interval between the suction pads 16C and 16D and the suction pads 16C and 16D is the same as that between the first column Y1 and column YM and the row interval between the suction units 16A and 16B or that between the suction pads 16C and 16D is the same as that between the IC sockets 5A and 5B. The transportation mechanism 16 moves the suction units 16A and 16B and the suction pads 16C and 16D together as one body in the direction of the x-axis.

The operation of the transportation mechanism illustrated in FIG. 14 will be described hereinafter with reference to FIGS. 15 to 17 showing the varying states thereof. FIGS. 15 to 17 are front views of the transportation mechanism in FIG. 14. In FIG. 14, denoted at 60 is a moving block, to which cylinders 16E and 16F are fixed. When the cylinder 16E is actuated, the suction units 16A and 16B move vertically being guided by a linear guide mounted on a side wall of the moving block 60. When the cylinder 16F is actuated, the suction pads 16C and 16D move vertically being guided by the other linear guide mounted on the other side wall of the moving block 60. A motor 60A is connected to a ball screw, which engages with a ball nut fixed to the moving block 60. When the motor 60A rotates, it moves the moving block 60 in the direction of the x-axis.

In a state illustrated in FIG. 15 (a), ICs 10 have been transported to the IC sockets 5A and 5B by the suction units 16A and 16B and next ICs 10 stand by on the supply stage 11. Incidentally, the measurement of the ICs 10 on the IC sockets 5A and 5B has been completed.

From the state in FIG. 15 (a), the moving block 60 moves to the side of the supply stage 11 to be in a state illustrated in FIG. 15 (b), wherein the suction units 16A and 16B are located above the supply stage 11 and the suction pads 16C and 16D are located above the IC sockets 5A and 5B.

From the state in FIG. 15 (b), the suction units 16A and 16B and the suction pads 16C and 16D descend so as to be in a state illustrated in FIG. 16 (a), wherein the suction units 16A and 16B retain ICs 10 on the IC sockets 5A and 5B by suction while the suction pads 16C and 16D retain ICs 10 on the IC sockets 5A and 5B by suction. From the state in FIG. 16 (a), the suction units 16A and 16B and the suction pads 16C and 16D ascend each with an IC 10 retained thereby so as to be in a state illustrated in FIG. 16 (b).

From the state in FIG. 16 (b), the moving block 60 moves to the side of the storage stage 12 so as to be in a state illustrated in FIG. 17 (a), wherein the suction units 16A and 16B are located above the IC sockets 5A and 5B, while the suction pads 16C and 16D are located above the storage stage 12.

From the state in FIG. 17 (a), the suction units 16A and 16B and the suction pads 16C and 16D descend so as to be in a state illustrated in FIG. 17 (b), wherein the suction units 16A and 16B press ICs 10 on the IC sockets 5A and 5B while the suction pads 16C and 16D release ICs 10 onto the recesses 12A and 12B on the storage stage 12.

From the state in FIG. 17 (b), when the ICs 10 on the storage stage 12 are transported to next process and next ICs 10 are supplied to the supply stage 11 upon completion of measuring the ICs 10 on the IC sockets 5A and 5B, the IC transportation mechanism returns to the state in FIG. 15 (a) so as to complete a series of transportation cycle.

It is difficult for the IC transportation mechanism having construction illustrated in FIG. 14 to shorten in time the series of transportation cycle since it requires time between the state in FIG. 15 (a) and that in FIG. 15 (b) and between that in FIG. 16 (b) and that in FIG. 17 (a). That is, the moving block 60 reciprocates between the supply stage 11 and the measuring portion 5 to supply the ICs 10 onto the IC sockets 5A and 5B and between the measuring portion 5 and the storage stage 12 as well to take out the ICs 10 from the IC sockets 5A and 5B, including wasteful processes.

SUMMARY OF THE INVENTION

It is the object of the present invention to provide an IC transportation mechanism provided with a first and a second groups of suction units for reducing process time, wherein the second group of suction units press ICs on IC sockets concurrently when the first group of suction units retain ICs on the supply stage by suction, the first group of the suction units press ICs on the IC sockets concurrently when the second group of suction units retain ICs on the supply stage by suction, the second group of suction units press ICs on the IC sockets concurrently when the first group of suction units release ICs onto the storage stage and the first group of suction units press ICs on the IC sockets concurrently when the second group of suction units release ICs onto the storage stage.

An IC transportation mechanism provided with a plurality of suction units according to a first aspect of the invention comprises a supply stage 1 which is arranged in the lower stage of a column Y1 to shift in the direction of the y-axis and is provided with recesses 1A and 1B disposed in a column for correcting ICs 10 in posture when the same are placed thereon, a storage stage 2 which is arranged in the upper stage of the column Y1 to shift in the direction of the y-axis and is provided with recesses 2A and 2B disposed in a column for correcting ICs 10 in posture when the same are placed thereon, a supply stage 3 which is arranged in the lower stage of a column Y2 to shift in the direction of the y-axis and is provided with recesses 3A and 3B disposed in a column for correcting ICs 10 in posture when the same are placed thereon, a storage stage 4 which is arranged in the upper stage of the column Y2 to shift in the direction of the y-axis and is provided with recesses 4A and 4B disposed in a column for correcting ICs 10 in posture when the same are placed thereon and a measuring portion 5 having IC sockets 5A and 5B disposed in a column and on a column YM equidistant from the column Y1 and column Y2, wherein a transportation mechanism 6 moves a first group of suction units 6A and 6B disposed in a column and a second group of suction units 6C and 6D disposed in a column together as one body in the direction of the x-axis, the second group of suction units 6C and 6D press ICs 10 on the IC sockets 5A and 5B concurrently when the first group of suction units 6A and 6B retain ICs 10 on the recesses 1A and 1B of the supply stage 1 by suction, the first group of the suction units 6A and 6B press ICs 10 on the IC sockets 5A and 5B concurrently when the second group of suction units 6C and 6D retain ICs 10 on the recesses 3A and 3B of the supply stage 3 by suction, the second group of suction units 6C and 6D press ICs 10 on the IC sockets 5A and 5B concurrently when the first group of suction units 6A and 6B release ICs 10 that have been measured onto the recesses 2A and 2B of the storage stage 2 and the first group of suction units 6A and 6B press ICs 10 on the IC sockets 5A and 5B concurrently when the second group of suction units 6C and 6D release ICs 10 that have been measured onto the recesses 4A and 4B of the storage stage 4.

An IC transportation mechanism provided with a plurality of suction units according to a second aspect of the invention comprises a moving stage 7 which shifts in the direction of the y-axis and is provided with recesses 7A and 7B disposed in a row group X1 for receiving ICs 10 therein and recesses 7C and 7D disposed in a row group X2 for storing ICs 10 therein, the recesses 7A and 7B and the recesses 7C and 7D being arranged on a column Y1, a moving stage 8 which shifts in the direction of the y-axis and is provided with recesses 8A and 8B disposed in a row group X3 for receiving ICs 10 therein and recesses 8C and 8D disposed in a row group X4 for storing ICs 10 therein, the recesses 8A and 8B and the recesses 8C and 8D being arranged on a column Y2, and a measuring portion 5 having IC sockets 5A and 5B disposed in a column and on a column YM equidistant from the columns Y1 and Y2, wherein a transportation mechanism 6 moves a first group of suction units 6A and 6B disposed in a column and a second group of suction units 6C and 6D disposed in a column together as one body in the direction of the x-axis, the second group of suction units 6C and 6D press ICs 10 on the IC sockets 5A and 5B concurrently when the first group of suction units 6A and 6B retain ICs 10 on the recesses 7A and 7B of the moving stage 7 by suction, the second group of the suction units 6C and 6D press ICs 10 on the IC sockets 5A and 5B concurrently when the first group of suction units 6A and 6B release ICs 10 that have been measured onto the recesses 7C and 7D of the moving stage 7 by suction, the first group of suction units 6A and 6B press ICs 10 on the IC sockets 5A and 5B concurrently when the second group of suction units 6C and 6D retain ICs 10 on the recesses 8A and 8B of the moving stage 8 by suction, the first group of suction units 6A and 6B press ICs 10 on the IC sockets 5A and 5B concurrently when the second group of suction units 6C and 6D release ICs 10 that have been measured onto the recesses 8C and 8D of the moving stage 8, the moving stage 7 shifts to the side opposite to the measuring portion 5 when ICs 10 are supplied to the moving stage 7 or those stored in the moving stage 7 after measurement are transported to next process and the moving stage 8 shifts to the side opposite to the measuring portion 5 when ICs 10 are supplied to the moving stage 8 or those stored in the moving stage 8 after measurement are transported to next process.

According to the first aspect of the invention, when the supply stage 1 is placed side by side with the IC sockets 5A and 5B on the same row, the storage stage 4 is also placed side by side therewith, and when the storage stage 2 is placed side by side with the IC sockets 5A and 5B on the same row, the supply stage 3 is also placed side by side therewith.

When the suction units 6A and 6B retain ICs 10 on the supply stage 1 by suction or release the same onto the storage stage 2, the suction units 6C and 6D press ICs 10 on the IC sockets 5A and 5B concurrently.

When the suction units 6C and 6D retain ICs 10 on the supply stage 3 by suction or release ICs 10 onto the storage stage 4, the suction units 6A and 6B press ICs 10 on the IC sockets 5A and 5B concurrently.

According to the second aspect of the invention, when the recesses 7A and 7B in the supply row group X1 on the moving stage 7 are placed side by side with the IC sockets 5A and 5B on the same rows, the recesses 8C and 8D in the storage row group X4 on the moving stage 8 are also placed side by side with the IC sockets 5A and 5B on the same rows, and when the recesses 7C and 7D in the supply row group X2 on the moving stage 7 are placed side by side with the IC sockets 5A and 5B on the same rows, the recesses 8A and 8B in the storage row group X3 on the moving stage 8 are also placed side by side with the IC sockets 5A and 5B on the same rows.

When the suction units 6A and 6B retain ICs 10 on the recesses 7A and 7B in the supply row group X1 by suction or release ICs 10 onto the recesses 7C and 7D in the storage row group X2, the suction units 6C and 6D press ICs 10 on the IC sockets 5A and 5B concurrently.

When the suction units 6C and 6D retain ICs 10 on the recesses 8A and 8B in the supply row group X3 by suction or release ICs 10 onto the recesses 8C and 8D in the storage row group X4, the suction units 6A and 6B press ICs 10 on the IC sockets 5A and 5B concurrently.

That is, according to the first and second aspects of the invention, it is possible to reduce process time about to half compared with prior art since the ICs 10 are taken in and out concurrently during a reciprocation cycle of the transportation mechanism 6.

DESCRIPTION OF THE PREFERRED EMBODIMENT

Figure 1:
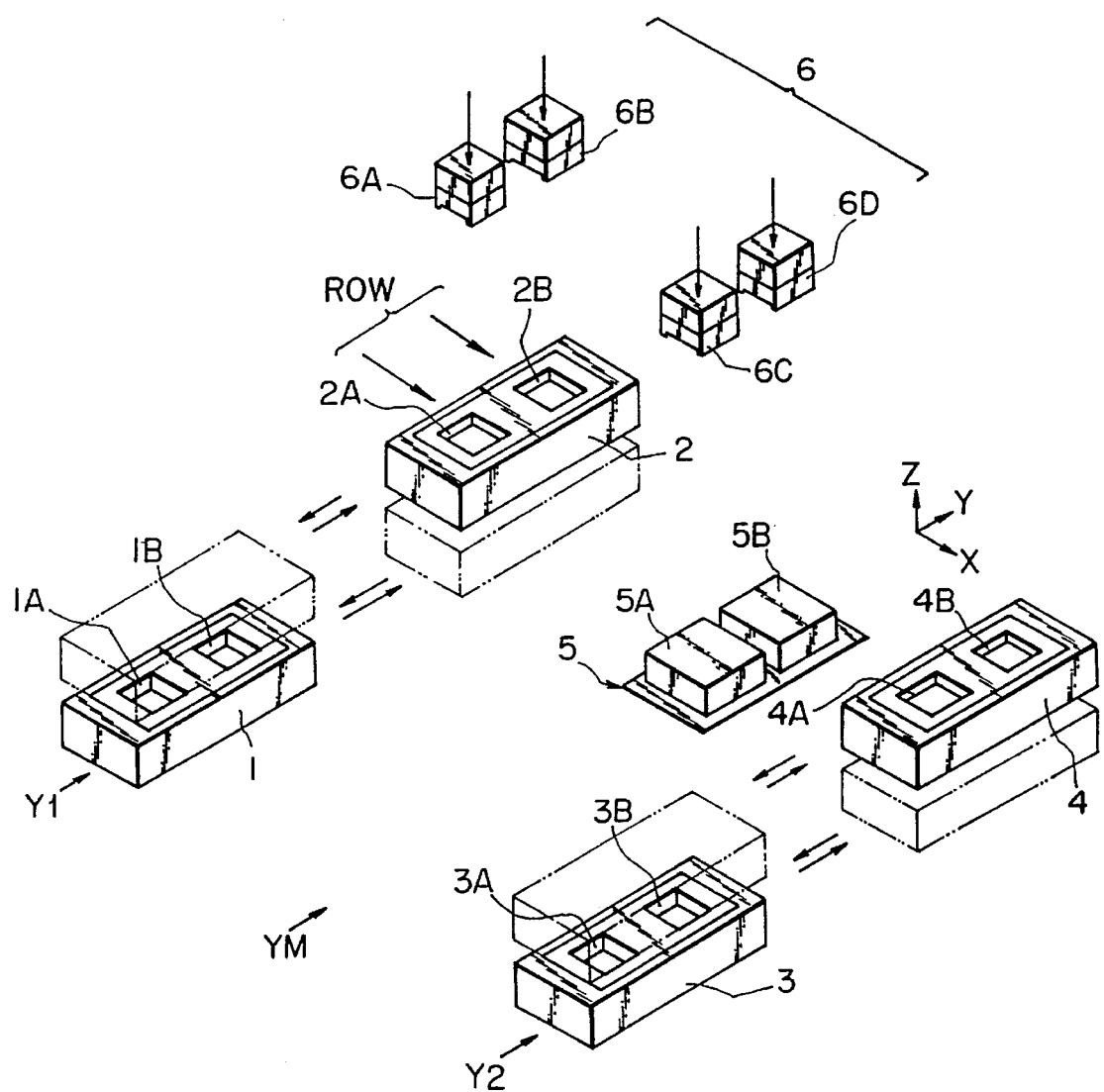
FIG. 1 is a view showing a structure of an IC transportation mechanism according to a first embodiment of the present invention.

The structure of an IC transportation mechanism according to a first embodiment of the present invention will be described hereinafter with reference to FIG. 1. In FIG. 1, denoted at 1 and 3 are supply stages, 2 and 4 are storage stages, 6 is a transportation mechanism, 6A to 6D are suction units and other components are denoted at the same numerals as those in FIG. 14.

In FIG. 1, The supply stage 1 is arranged in the lower stage of a first column Y1 and shifts in the direction of the y-axis. The supply stage 1 comprises recesses 1A and 1B disposed on different rows. When ICs 10 are placed on the recesses 1A and 1B, the ICs 10 are corrected in posture. The storage stage 2 is arranged in the upper stage of the first column Y1 and shifts in the direction of the y-axis. The storage stage 2 comprises recesses 2A and 2B disposed on different rows. When ICs 10 are placed on the recesses 2A and 2B, the ICs 10 are corrected in posture.

The supply stage 3 is arranged in the lower stage of a second column Y2 and shifts in the direction of the y-axis. The supply stage 3 comprises recesses 3A and 3B disposed on different rows. When ICs 10 are placed on the recesses 3A and 3B, the ICs 10 are corrected in posture. The storage stage 4 is arranged in the upper stage of the second column Y2 and shifts in the direction of the y-axis. The storage stage 4 comprises recesses 4A and 4B disposed on different rows. When ICs 10 are placed on the recesses 4A and 4B, the ICs 10 are corrected in posture.

Figure 13A:
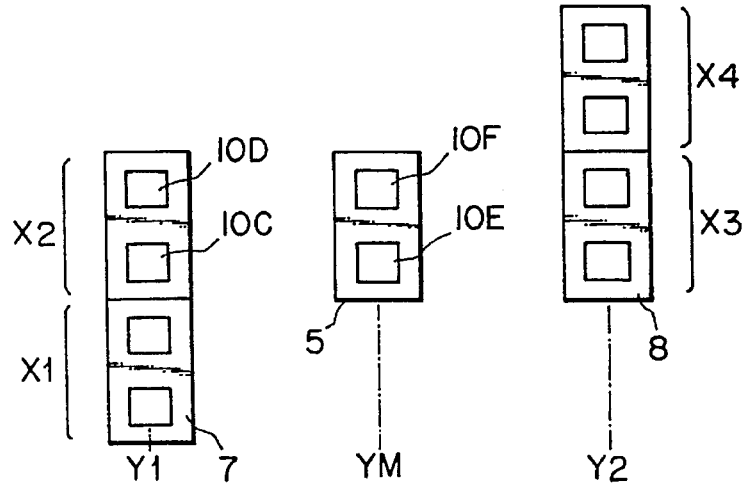
FIGS. 13(*a*) and 13(*b*) show the varying states of the IC transportation mechanism following those in FIG. 12.
Figure 13B:
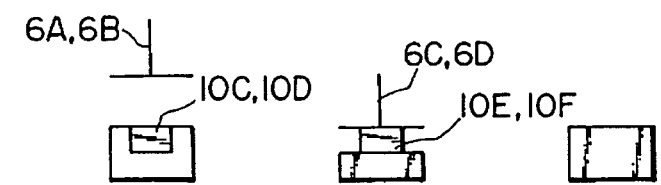

Each of the recesses 1A and 1B, recesses 2A and 2B, recesses 3A and 3B and recesses 4A and 4B in FIG. 1 is the same in shape as each of the recesses 11A and 11B and recesses 12A and 12B in FIG. 13 and facilitates the positioning of the ICs 10. The recesses 1A and 1B, the recesses 2A and 2B, the recesses 3A and 3B and the recesses 4A and 4B are the same in row interval as the IC sockets 5A and 5B. Moreover, the centers of the recesses 1A and 1B and the recesses 2A and 2B are disposed on the column Y1 while those of the recesses 3A and 3B and the recesses 4A and 4B are disposed on the column Y2.

In FIG. 1, ICs 10 are supplied to the recesses of the supply stages 1 and 3 when the same are at the side opposite to the measuring portion, or test station 5. Whereas ICs 10 are taken out from the recesses of the storage stages 2 and 4 when the same are at the side opposite to the test station 5 so as to be transported to next process.

Figure 14:
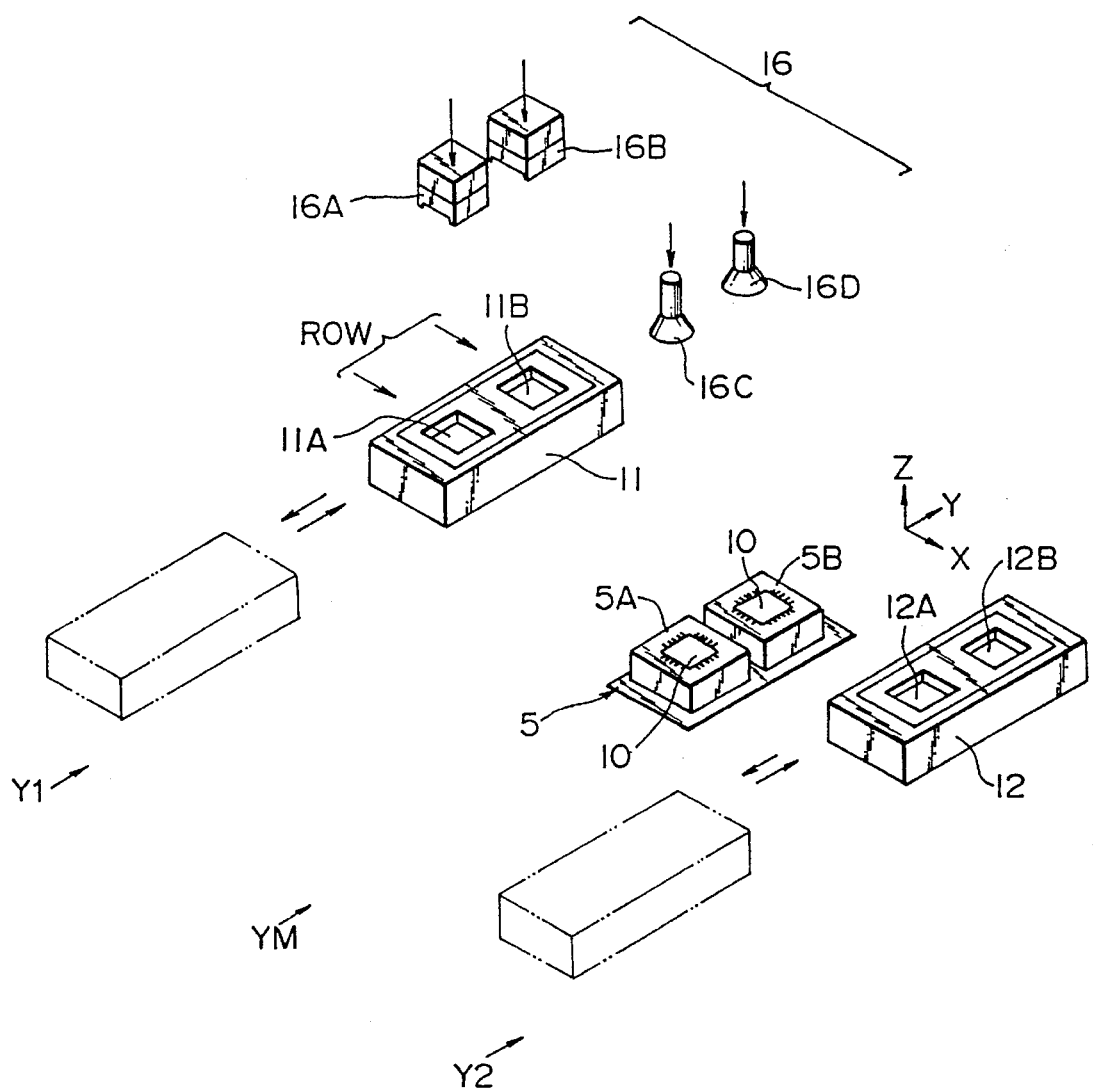
FIG. 14 is a view showing a structure of an IC transportation mechanism of prior art.
Figure 15A:
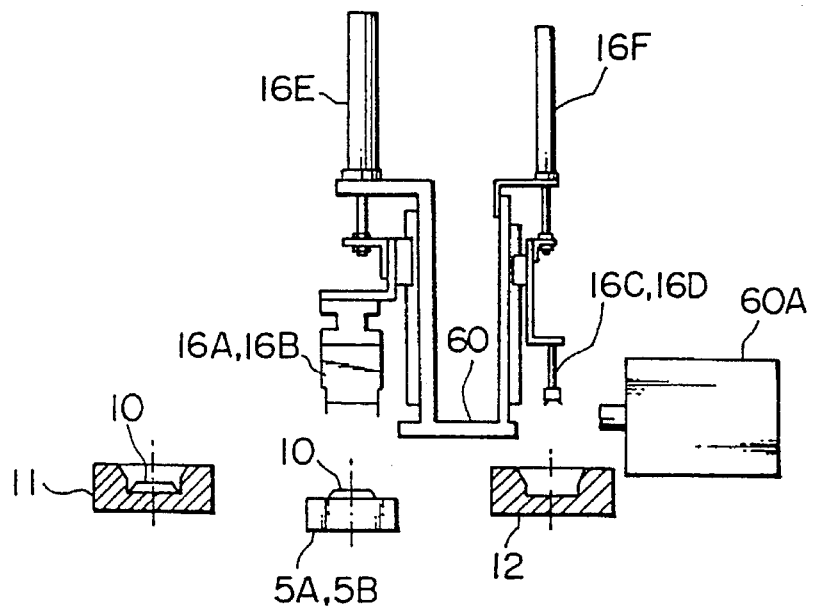
FIGS. 15(*a*) and 15(*b*) show the varying states of the IC transportation mechanism in FIG. 13.
Figure 15B:
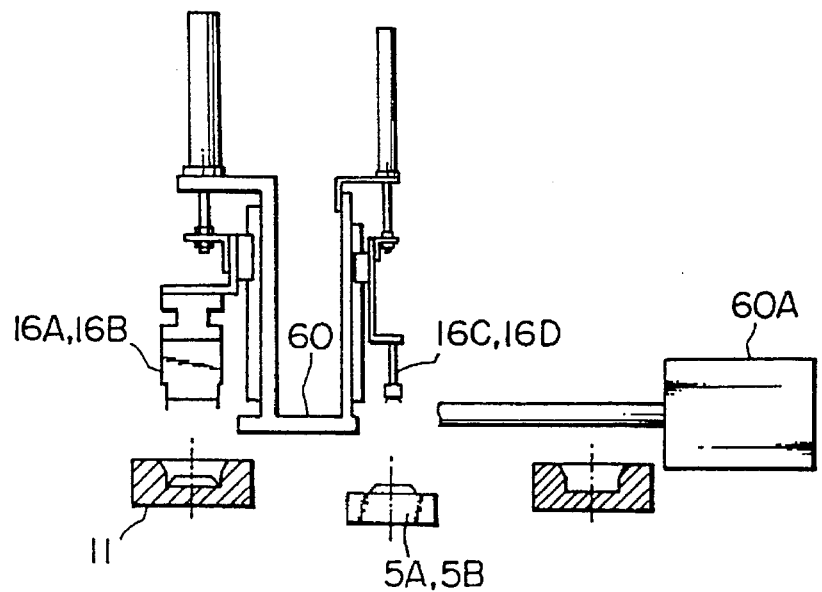
Figure 16A:
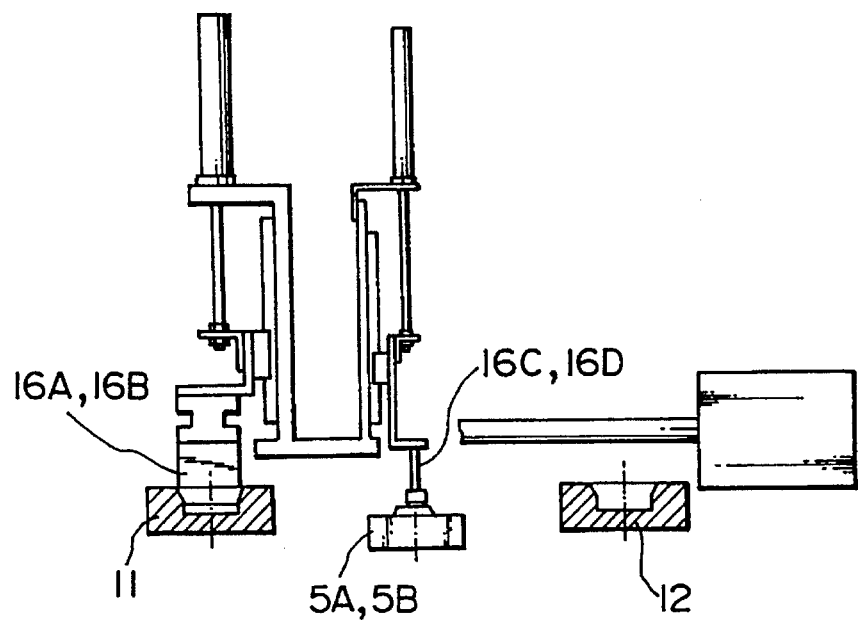
FIGS. 16(*a*) and 16(*b*) show the varying states of the IC transportation mechanism following those in FIG. 14.
Figure 16B:
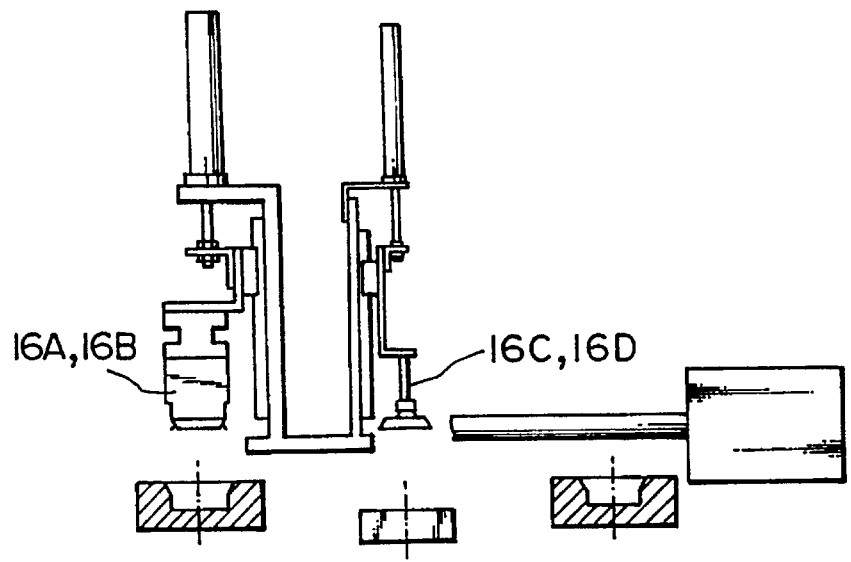
Figure 17A:
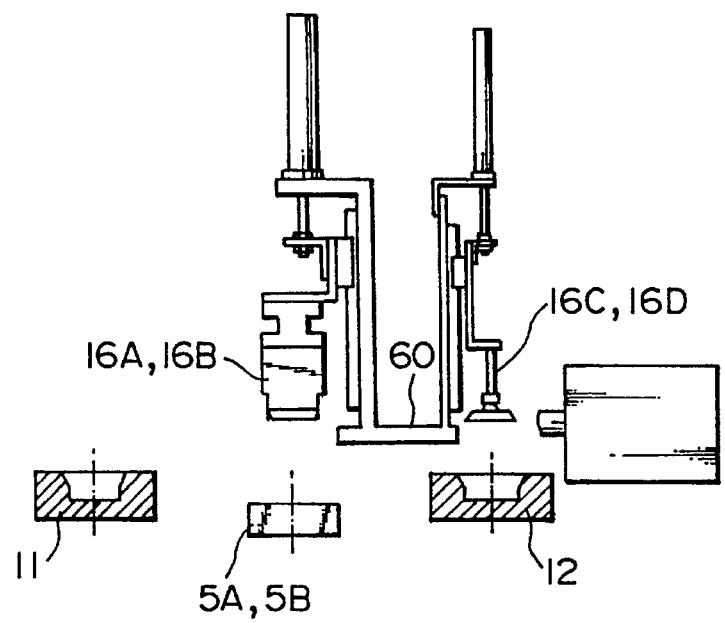
FIGS. 17(*a*) and 17(*b*) show the varying states of the IC transportation mechanism following those in FIG. 15.
Figure 17B:
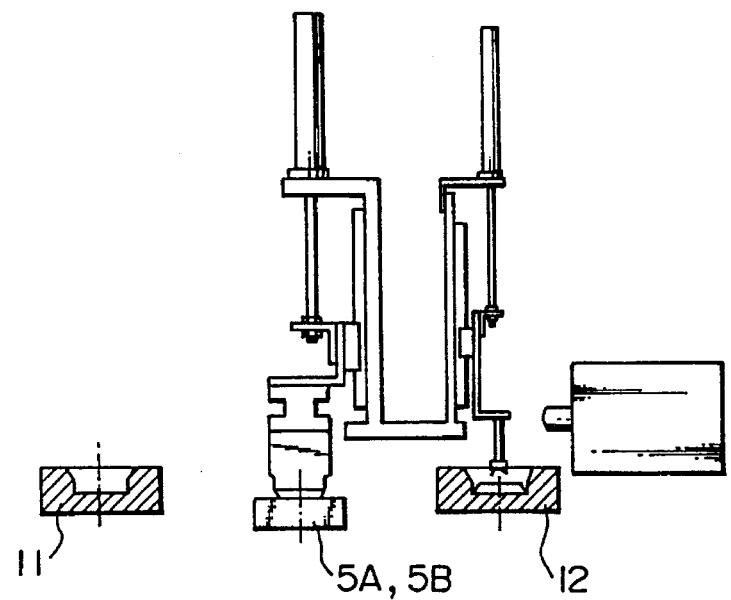

The transportation mechanism 6 comprises a first group of suction units 6A and 6B and a second group of suction units 6C and 6D. The suction units 6A to 6D are the same as the suction units 16A and 16B in FIG. 13. That is, the suction pads 16C and 16D in the transportation mechanism in FIG. 14 are replaced with the suction units 6C and 6D in the transportation mechanism 6 in FIG. 1.

Figure 2A:
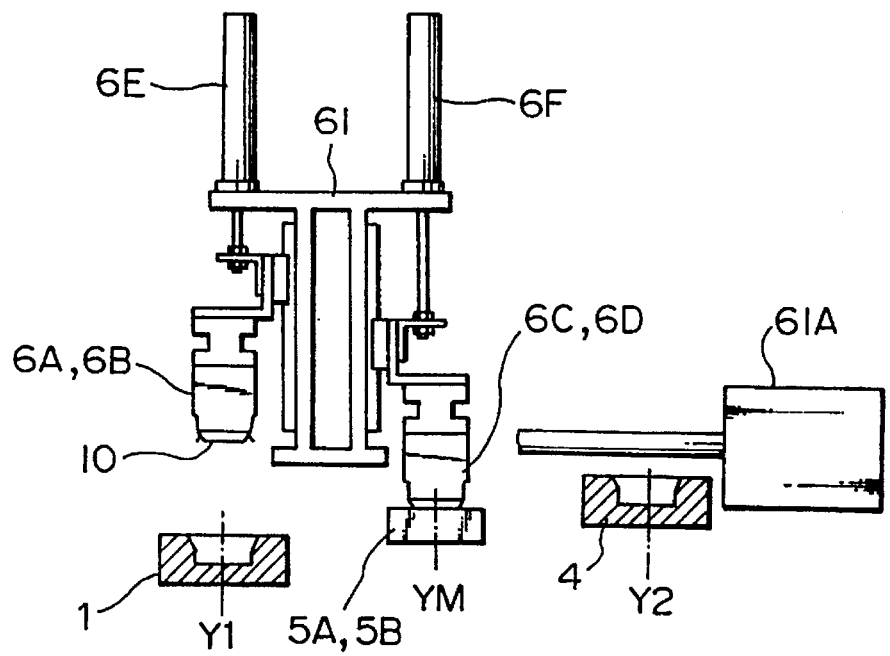
FIGS. 2(*a*) and 2(*b*) show the varying states of the IC transportation mechanism in FIG. 1 for explaining the operation thereof.
Figure 2B:
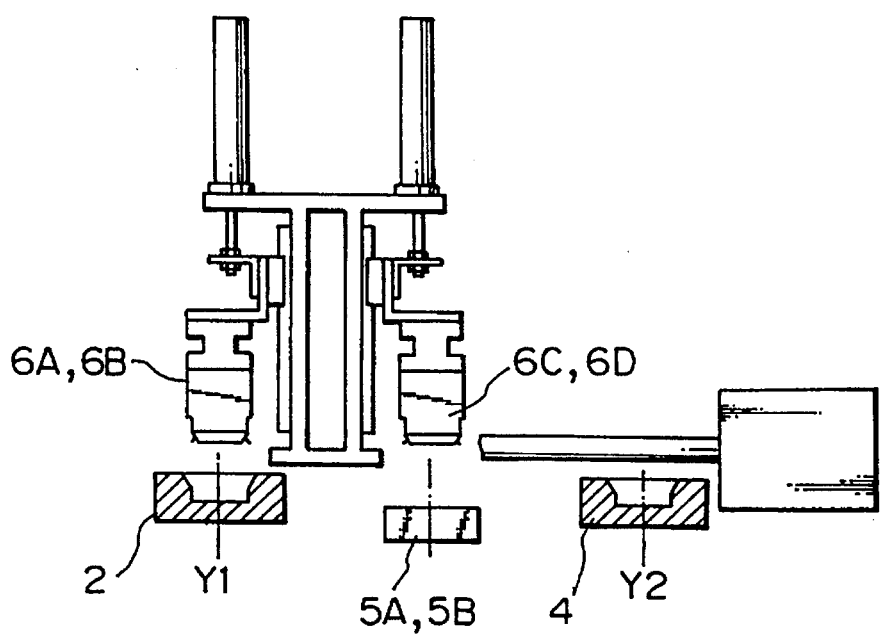
Figure 3A:
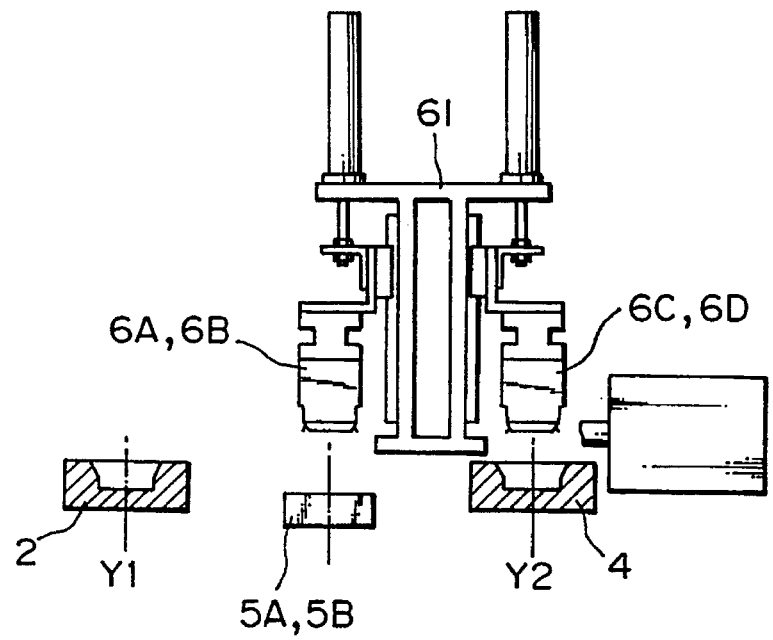
FIGS. 3(*a*) and 3(*b*) show the varying states of the IC transportation mechanism following those in FIG. 2.
Figure 3B:
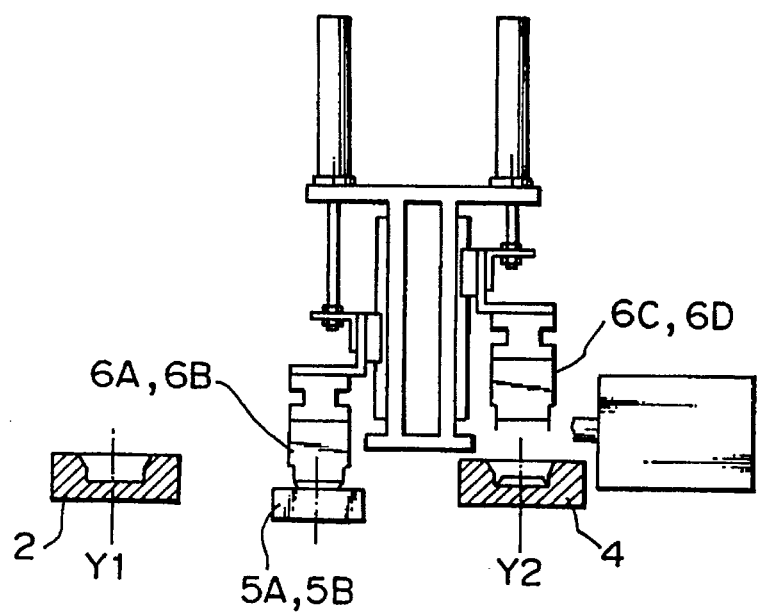
Figure 4A:
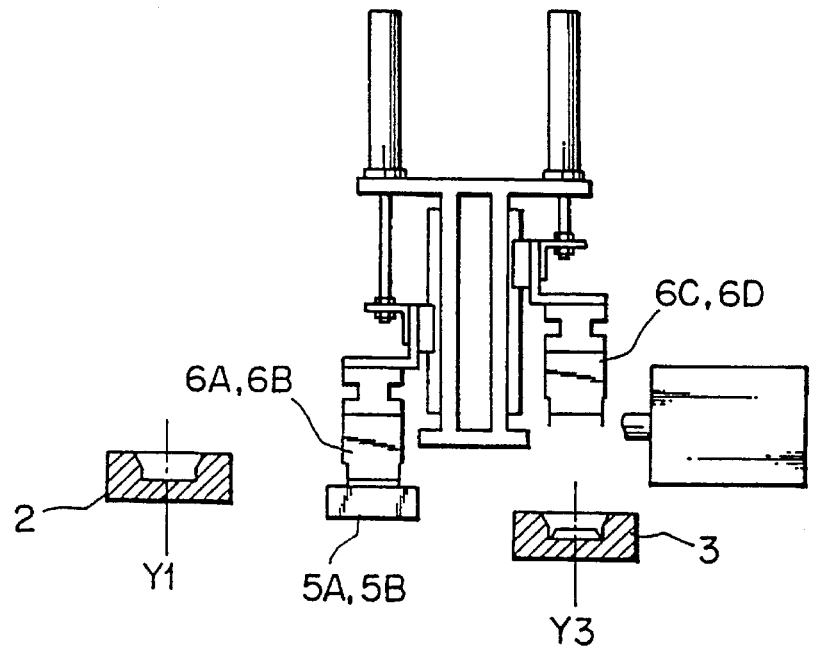
FIGS. 4(*a*) and 4(*b*) show the varying states of the IC transportation mechanism following those in FIG. 3.
Figure 4B:
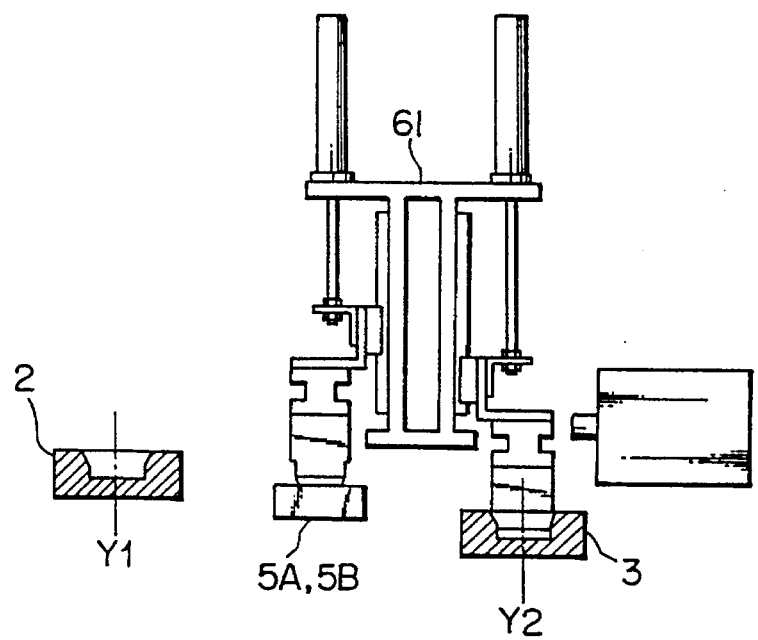

The operation of the IC transportation mechanism in FIG. 1 will be described hereinafter with reference to FIGS. 2 to 4 showing the varying states thereof. FIGS. 2 to 4 are front views of the IC transportation mechanism in FIG. 1. In FIG. 2, denoted at 61 is a moving block, to which a cylinder 6E and a cylinder 6F are attached. When the cylinder 6E is actuated, the suction units 6A and 6B move vertically being guided by a linear guide mounted on a side wall of the moving block 61. When the cylinder 6F is actuated, the suction units 6C and 6D move vertically being guided by the other linear guide mounted on the other side wall of the moving block 61. A motor 61A is connected to a ball screw, which engages with a ball nut mounted on the moving block 61. When the motor 61A rotates, it moves the moving block 61 in the direction of the x-axis.

In a state illustrated in FIG. 2 (*a*), the supply stage 1 on the first column Y1 and the storage stage 4 on the second column Y2 have shifted to the side of the measuring portion 5 to stand by. The suction units 6C and 6D have descended to press ICs 10 while the suction units 6A and 6B have ascended with ICs 10 retained thereby by suction to stand by until the completion of measurement.

From the state illustrated in FIG. 2 (*a*), the supply stage 1 on the first column Y1 shifts to the side opposite to the test station 5 and the storage stage 2 on the first column Y1 shifts to the side of the measuring portion 5 to stand by. Upon completion of measurement in the state in FIG. 2 (a), the suction units 6C and 6D ascend with ICs 10 retained thereby by suction, the ICs 10 having been on the measuring portion 5, so as to be in a state illustrated in FIG. 2 (b).

From the state in FIG. 2 (b), the moving block 61 moves to the side of the second column Y2 so as to be in a state illustrated in FIG. 3 (a), in which the suction units 6A and 6B are located above the IC sockets 5A and 5B while the suction units 6C and 6D are located above the storage stage 4 on the second column Y2.

From the state in FIG. 3 (a), the suction units 6A and 6B descend to press ICs 10 on the IC sockets 5A and 5B while the suction units 6C and 6D release ICs 10 onto the storage stage 4 on the second column Y2 so as to be in a state illustrated in FIG. 3 (b).

From the state in FIG. 3 (b), the storage portion 4 on the second column Y2 shifts to the other side opposite to the measuring portion 5 and the supply stage 3 on the second column Y2 shifts to the side of the test station 5 with ICs 10 held thereon to be measured next so as to be in a state illustrated in FIG. 4 (a). In FIG. 4 (a), the suction units 6A and 6B press ICs 10 since the measurement of the same has not been completed yet.

From the state in FIG. 4 (a), the suction units 6C and 6D descend to retain ICs 10 on the supply stage 3 on the second column Y2 by suction so as to be in a state illustrated in FIG. 4 (b).

From the state in FIG. 4 (b), the suction units 6C and 6D ascend with ICs 10 retained thereby by suction. Upon completion of testing of ICs 10, the suction units 6A and 6B ascend with the ICs 10 retained thereby by suction from the IC sockets 5A and 5B.

Then the moving block 61 moves to the side of the first column Y1 and the suction units 6A and 6B release ICs 10 that have been measured onto the storage stage 2 on the first column Y1. At the same time, the suction units 6C and 6D press ICs 10 on the IC sockets 5A and 5B. Thereafter the storage stage 2 on the first column Y1 shifts to the other side opposite to the measuring portion 5, the supply stage 1 on the first column Y1 shifts to the side of the measuring portion 5 with ICs 10 held thereon to be measured next and the suction units 6A and 6B descend to retain ICs 10 on the supply stage 1 on the first column Y1 by suction and ascend therewith so as to return to the state in FIG. 2 (a).

Figure 5:
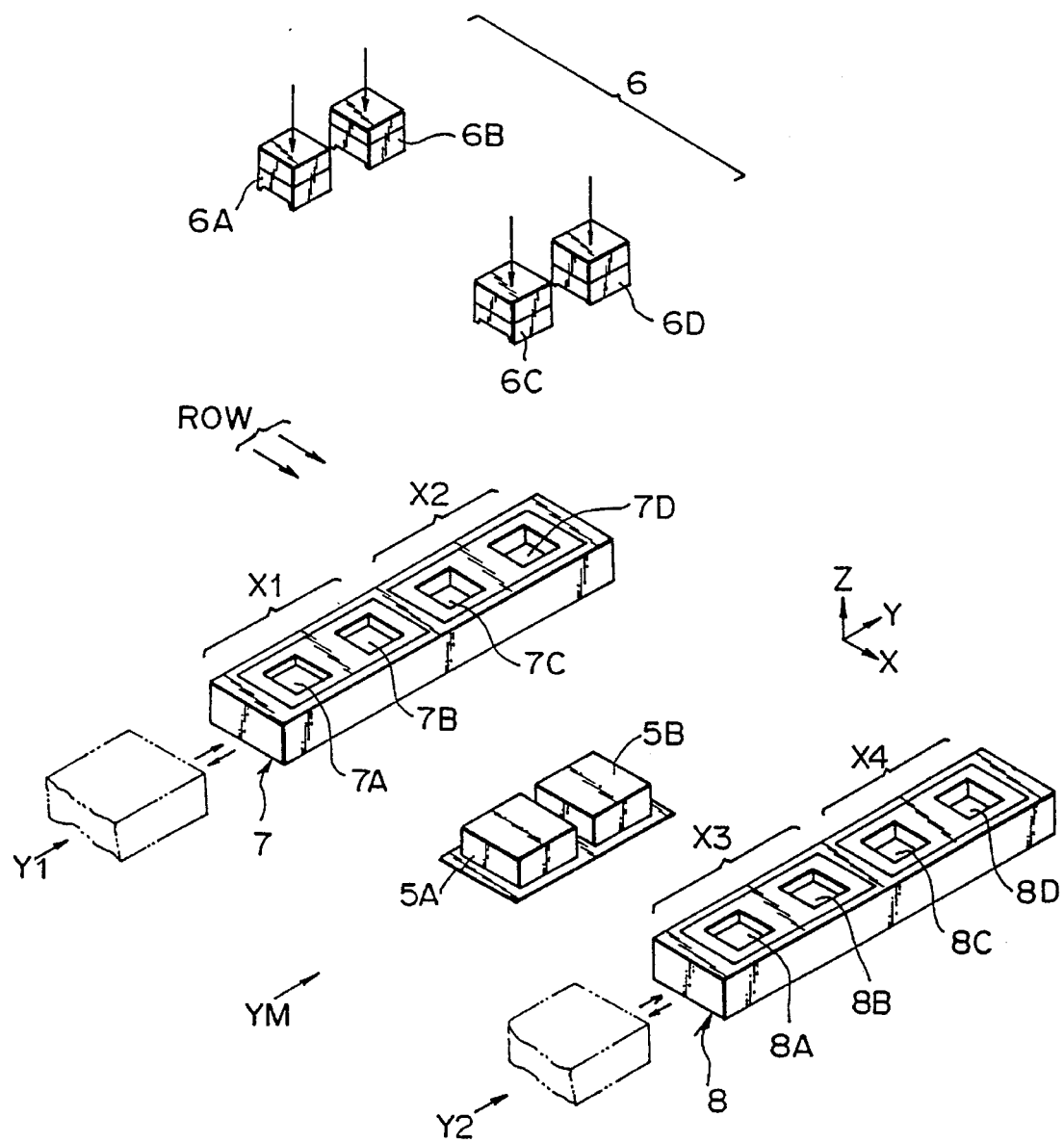
FIG. 5 is a view showing a structure of the IC transportation mechanism according to a second embodiment of the present invention.

The structure of the IC transportation mechanism according to a second aspect of the invention will be described with reference to FIG. 5. In FIG. 5, denoted at 7 is a first moving stage, 8 is a second moving stage and other components are the same as those illustrated in FIG. 1. That is, the moving stage 7 is a combination of the supply stage 1 and the storage stage 2 in FIG. 1 arranged as one body, while the moving stage 8 is a combination of the supply stage 3 and the storage stage 4 in FIG. 1 arranged as one body.

In FIG. 5, the moving stage 7 is arranged on the first column Y1 and shifts in the direction of the y-axis. The moving stage 7 comprises recesses 7A and 7B disposed in a row group X1 for receiving ICs 10 thereon and recesses 7C and 7D disposed in a row group X2 for storing ICs 10 thereon. When ICs 10 are placed on the recesses 7A to 7D, the ICs 10 are corrected in posture.

The moving stage 8 is arranged on the second column Y2 and shifts in the direction of the y-axis. The moving stage 8 comprises recesses 8A and 8B disposed in a row group X3 for receiving ICs 10 thereon and recesses 8C and 8D disposed in a row group X4 for storing ICs 10 thereon. When ICs 10 are placed on the recesses 8A to 8D, the ICs 10 are corrected in posture.

The recesses 7A to 7D and the recesses 8A to 8D are the same as those in FIG. 1. Each row interval among the recesses 7A and 7B, the recesses 7C and 7D, the recesses 8A and 8B and the recesses 8C and 8D is the same as that between the IC socket 5A and the IC socket 5B. Moreover, the centers of the recesses 7A to 7D are arranged on the column Y1 and those of the recesses 8A to 8D are arranged on the column Y2. The upper surface of the moving stage 7 and that of the moving stage 8 are disposed on the same surface.

The operation of the IC transportation mechanism in FIG. 1 will be described hereinafter with reference to FIGS. 6 to 13 which show the varying states of the IC transportation mechanism. FIGS. 6 to 13 (a) are plan views of the IC transportation mechanism illustrated in FIG. 5 and FIG. 13 (b) is a front view thereof. The transportation mechanism 6 is the same as that illustrated in FIG. 14.

Figure 6A:
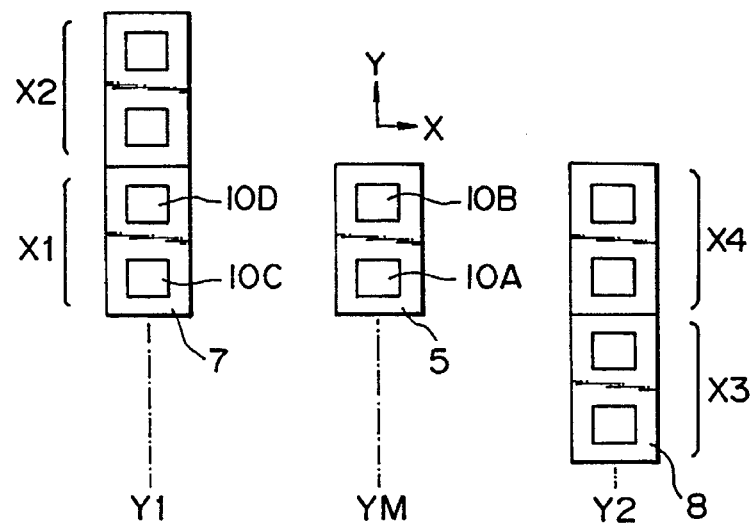
FIGS. 6(*a*) and 6(*b*) show the varying states of the IC transportation mechanism in FIG. 5 for explaining the operation thereof.
Figure 6B:
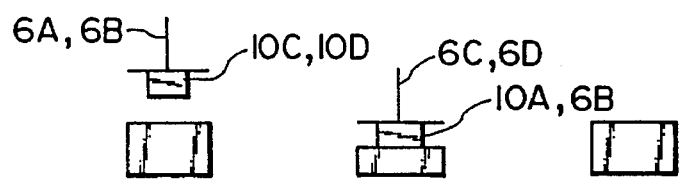

In the state illustrated in FIG. 6, the recesses 7A and 7B in the row group X1 of the moving stage 7 are placed side by side with the IC sockets 5A and 5B of the measuring portion 5 and the recesses 8C and 8D in the row group X4 of the moving stage 8 are placed side by side with the IC sockets 5A and 5B of the measuring portion 5. The suction units 6C and 6D have descended to press ICs 10A and 10B, while the suction units 6A and 6B have ascended with ICs 10C and 10D retained thereby by suction from the recesses 7A and 7B in the row group X1 to stand by there until the completion of measurement.

Figure 7A:
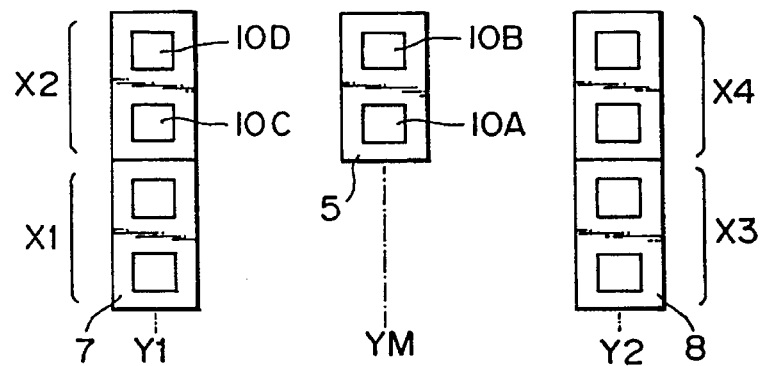
FIGS. 7(*a*) and 7(*b*) show the varying states of the IC transportation mechanism following those in FIG. 6.
Figure 7B:
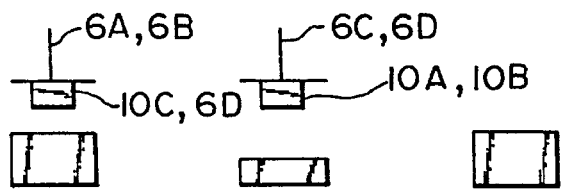

Upon completion of measurement in the state in FIG. 6, the suction units 6C and 6D ascend with the ICs 10A and 10B retained thereby by suction from the measuring portion 5 so as to be in a state as illustrated in FIG. 7. From the state in FIG. 7, the moving block 61 moves to the side of the moving stage 7 so as to be in a state illustrated in FIG. 8. In the state in FIG. 8, the suction units 6A and 6B are located above the IC sockets 5A and 5B and the suction units 6C and 6D are located above the recesses 8C and 8D in the row group X4 of the moving stage 8.

Figure 8A:
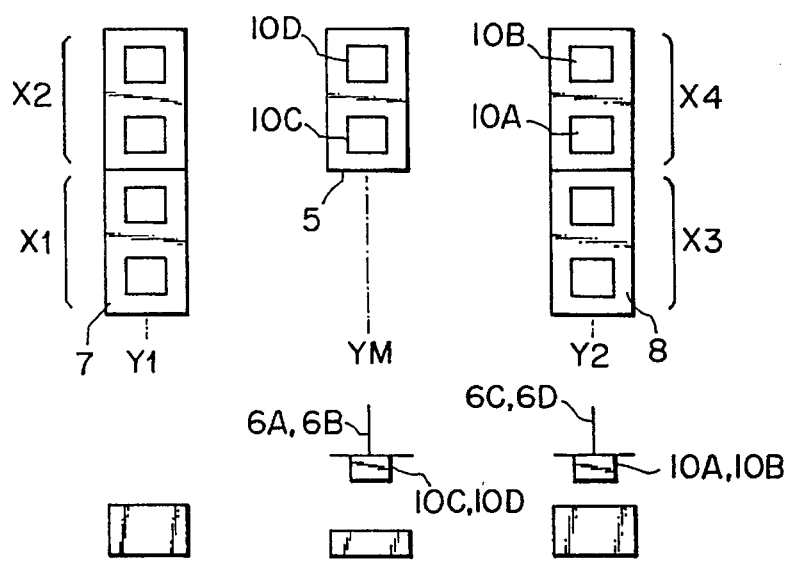
FIGS. 8(*a*) and 8(*b*) show the varying states of the IC transportation mechanism following those in FIG. 7.
Figure 8B:
Figure 9A:
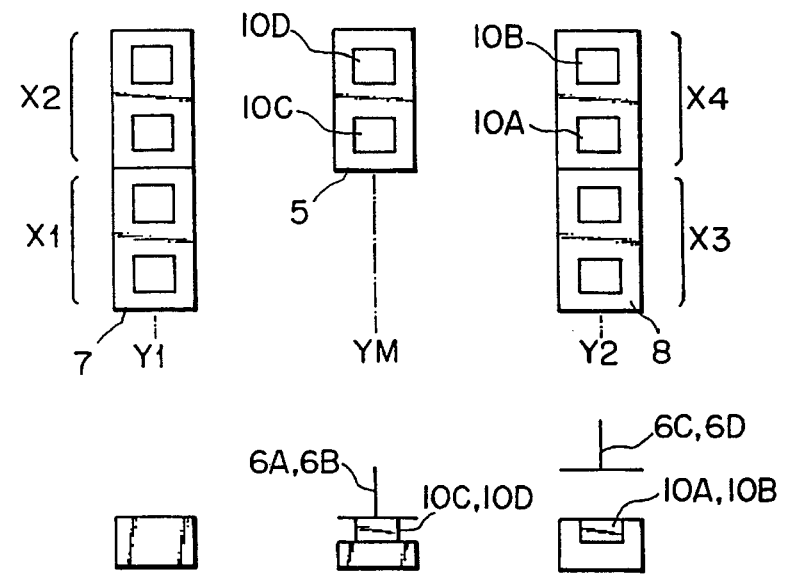
FIGS. 9(*a*) and 9(*b*) show the varying states of the IC transportation mechanism following those in FIG. 8.
Figure 9B:

From the state in FIG. 8, the suction units 6A and 6B descend to press the ICs 10C and 10D on the IC sockets 5A and 5B and at the same time the suction units 6C and 6D release the ICs 10A and 10B onto the recesses 8C and 8D in the row group X4 of the moving stage 8 so as to be in a state illustrated in FIG. 9.

Figure 10A:
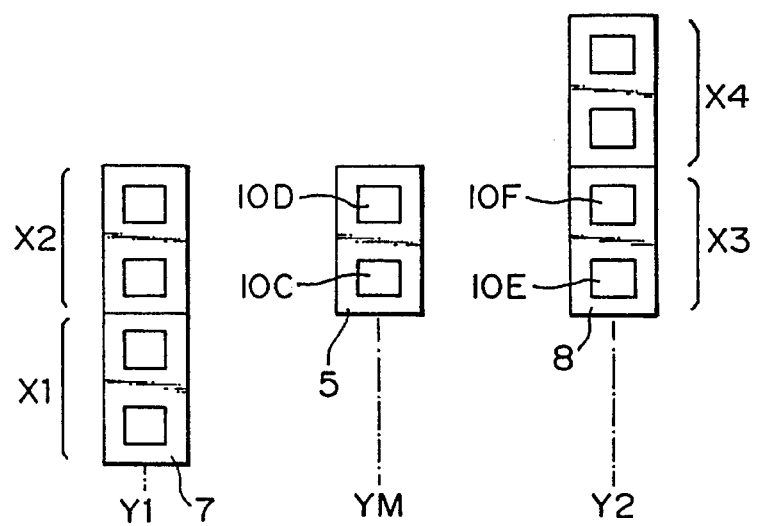
FIGS. 10(*a*) and 10(*b*) show the varying states of the IC transportation mechanism following those in FIG. 9.
Figure 10B:
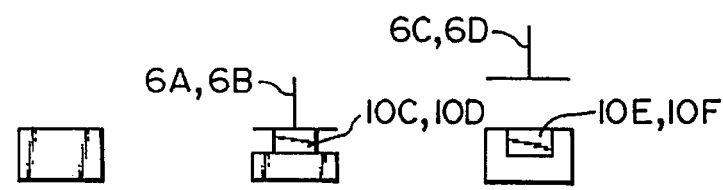

From the state in FIG. 9, the moving stage 8 shifts to the other side opposite to the test station 5 to receive ICs 10E and 10F to be measured next on the recesses 8A and 8B in the row group X3 of the moving stage 8 and returns to the side of the test station 5 therewith so as to be in a state illustrated in FIG. 10. In FIG. 10, the suction units 6A and 6B press the ICs 10C and 10D since the measurement thereof is not completed yet.

Figure 11A:
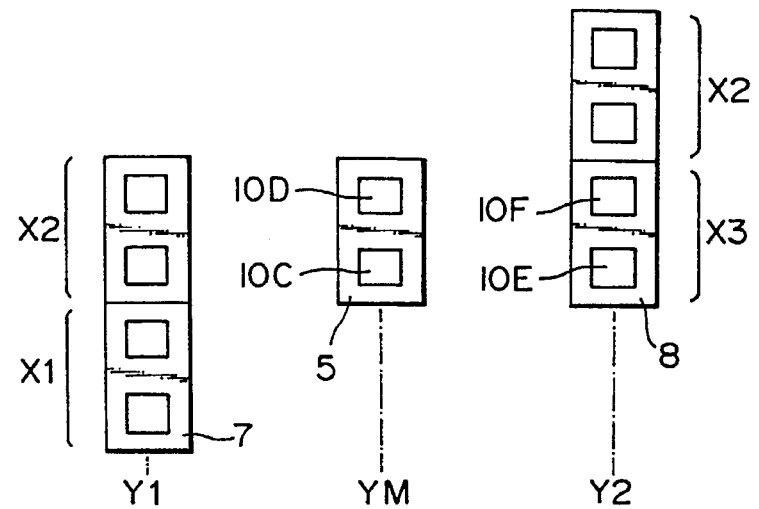
FIGS. 11(*a*) and 11(*b*) show the varying states of the IC transportation mechanism following those in FIG. 10.
Figure 11B:
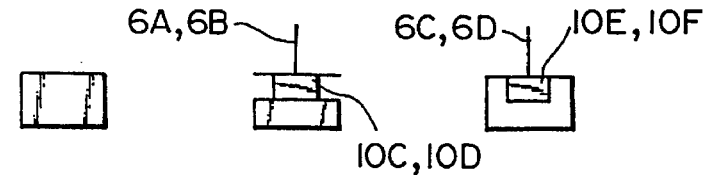

From the state in FIG. 10, the suction units 6C and 6D descend to retain the ICs 10E and 10F on the recesses 8A and 8B in the row group X3 of the moving stage 8 by suction so as to be in a state illustrated in FIG. 11.

Figure 12A:
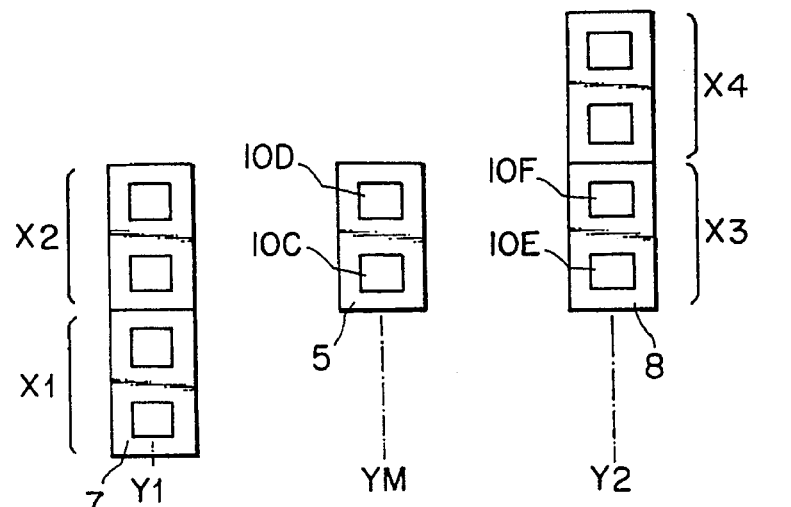
FIGS. 12(*a*) and 12(*b*) show the varying states of the IC transportation mechanism following those in FIG. 11.
Figure 12B:
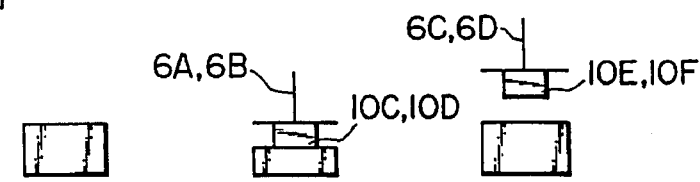

From the state in FIG. 11, the suction units 6C and 6D ascend with the ICs 10E and 10F retained thereby by suction so as to be in a state illustrated in FIG. 12. Upon completion of measurement of the ICs 10C and 10D, the suction units 6A and 6B ascend with the ICs 10C and 10D retained thereby by suction. Then the moving block 61 moves to the side of the moving stage 7 and the suction units 6A and 6B release the ICs 10C and 10D that have been measured onto the recesses 7C and 7D in the row group X2 of the moving stage 7. At the same time, the suction units 6C and 6D press the ICs 10E and 10F on the IC sockets 5A and 5B so as to be in a state illustrated in FIG. 13.

Thereafter the moving stage 7 shifts to the other side opposite to the measuring portion 5 to receive ICs 10G and 10H to be measured next thereon and returns therewith to the side of the measuring portion 5 and the suction units 6A and 6B descend to retain the ICs 10G and 10H on the recesses 7A and 7B in the row group X1 of the moving stage 7 by suction and ascend therewith so as to return to the state in FIG. 6.

According to the present invention, it is possible to reduce process time by providing a first group of suction units and a second group of suction units, wherein when the first group of suction units retain ICs on the supply stage by suction, the second group of suction units concurrently press ICs on IC sockets, when the second group of suction units retain ICs on the supply stage by suction, the first group of suction units concurrently press ICs on the IC sockets, when the first group of suction units release ICs onto the storage stage, the second group of suction units concurrently press ICs on the IC sockets and when the second group of suction units release ICs onto the storage stage, the first group of suction units concurrently press ICs on the IC sockets.

What is claimed is:

1. An IC transportation mechanism provided with a plurality of suction units, said IC transportation mechanism comprising:

a first moving stage which shifts in a direction of the y-axis and is provided with recesses disposed in a first row group for receiving ICs therein and recesses disposed in a second row group for storing ICs therein, said first and second recesses being arranged on a first column;

a second moving stage which shifts in the direction of the y-axis and is provided with recesses disposed in a third row group for receiving ICs therein and recesses disposed in a fourth row group for storing ICs therein, said third and fourth recesses being arranged on a second column; and a measuring portion having IC sockets disposed in a column and on a column equidistant from said first and second columns; wherein a transportation mechanism moves a first group of suction units disposed in a column and a second group of suction units disposed in a column together as one body in a direction of the x-axis;

said second group of suction units press ICs on said IC sockets concurrently when said first group of suction units retain ICs on said recesses disposed in said first row group on said first moving stage by suction;

said second group of suction units press ICs on said IC sockets concurrently when said first group of suction units release ICs that have been measured onto said recesses disposed in said second row group on said first moving stage by suction;

said first group of suction units press ICs on said IC sockets concurrently when said second group of suction units retain ICs on said recesses disposed in said third row group on said second moving stage;

said first group of suction units press ICs on said IC sockets concurrently when said second group of suction units release ICs that have been measured onto said recesses disposed in said fourth row group on said second moving stage;

said first moving stage shifts to a side opposite to said measuring portion when ICs are supplied to said first moving stage or those stored in said first moving stage after measurement are transported to next process; and said second moving stage shifts to a side opposite to said measuring portion when ICs are supplied to said second moving stage or those stored in said second moving stage after measurement are transported to next process.

2. The IC transportation mechanism according to claim 1, wherein said first moving stage and said second moving stage move synchronously so that said first row group and said fourth row group align in the x-axis direction with said IC sockets and said second row group and said third row group align in the x-axis direction with said IC sockets.

* * * * *

UNITED STATES PATENT AND TRADEMARK OFFICE
CERTIFICATE OF CORRECTION

PATENT NO. : 5,596,270
DATED : January 21, 1997
INVENTOR(S) : Osamu Mitsui

It is certified that error appears in the above-indentified patent and that said Letters Patent is hereby corrected as shown below:

On the title page, item [54] and col. 1, line 3.
after "SUCTION" insert ---UNITS---.

Signed and Sealed this

Twenty-fourth Day of June, 1997

Attest:

BRUCE LEHMAN

Attesting Officer

Commissioner of Patents and Trademarks